(12) United States Patent
Shih et al.

(10) Patent No.: US 7,578,889 B2
(45) Date of Patent: Aug. 25, 2009

(54) METHODOLOGY FOR CLEANING OF SURFACE METAL CONTAMINATION FROM ELECTRODE ASSEMBLIES

(75) Inventors: Hong Shih, Walnut, CA (US); Yaobo Yin, Pleasanton, CA (US); Shun Jackson Wu, Cupertino, CA (US); Armen Avoyan, Glendale, CA (US); John E. Daugherty, Newark, CA (US); Linda Jiang, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 339 days.

(21) Appl. No.: 11/730,300

(22) Filed: Mar. 30, 2007

(65) Prior Publication Data
US 2008/0236620 A1    Oct. 2, 2008

(51) Int. Cl.
*B08B 3/04* (2006.01)

(52) U.S. Cl. .......................... 134/26; 427/488; 427/489; 427/490; 427/491; 427/523; 427/524; 427/525; 427/526; 427/527; 427/528; 427/529; 427/530; 427/531; 427/533; 427/534; 427/535; 427/536; 427/537; 427/538; 427/539; 427/562; 427/563; 427/564; 427/569; 427/570; 427/571; 427/572; 427/573; 427/574; 427/575; 427/576; 427/577; 427/578; 427/579; 216/52; 216/53; 216/67; 216/83; 216/84; 216/96; 216/99; 216/100; 216/101; 216/102; 216/103; 216/104; 216/105; 216/106; 216/107; 216/108; 216/109; 134/1; 134/2; 134/3; 134/28; 134/34; 134/36; 134/41; 134/42; 134/104.1; 134/150; 134/166 R; 134/170

(58) Field of Classification Search ......... 427/488–491, 427/523–531, 533–539, 569–579, 562–564; 216/52, 53, 67, 83, 84, 96, 99, 100–109; 438/905; 134/1, 2, 3, 26, 28, 34, 36, 41, 134/42, 104.1, 150, 166 R, 170
See application file for complete search history.

(56) References Cited

U.S. PATENT DOCUMENTS 4,713,119 A    12/1987    Earhart et al.

(Continued)

FOREIGN PATENT DOCUMENTS

JP    02119224 A    5/1990

(Continued)

OTHER PUBLICATIONS

Shibanom, Yoshihide, "Ultrasonic Cleaning Applications in the Semiconductor and Computer Industry", Abstract; R&M Library Citation (http://quanterion.com/RIAC/Library/Library.asp?ArgVal=45561-010), Mar. 1994.

(Continued)

*Primary Examiner*—Sharidan Carrillo
(74) *Attorney, Agent, or Firm*—Buchanan Ingersoll & Rooney PC (57) ABSTRACT

Systematic and effective methodology to clean capacitively coupled plasma reactor electrodes and reduce surface roughness so that the cleaned electrodes meet surface contamination specifications and manufacturing yields are enhanced. Pre-cleaning of tools used in the cleaning process helps prevent contamination of the electrode being cleaned.

18 Claims, 3 Drawing Sheets

U.S. PATENT DOCUMENTS

| | | |
|---|---|---|
| 5,660,640 A | 8/1997 | Laube |
| 6,003,526 A | 12/1999 | Lo et al. |
| 6,376,385 B2 | 4/2002 | Lilleland et al. |
| 6,376,977 B1 | 4/2002 | Kawai et al. |
| 6,607,605 B2 | 8/2003 | Tan |
| 6,790,289 B2 | 9/2004 | Takase et al. |
| 6,841,008 B1 | 1/2005 | Branco et al. |
| 6,983,892 B2 | 1/2006 | Noorbakhsh et al. |
| 7,052,553 B1 | 5/2006 | Shih et al. |
| 2002/0127853 A1 | 9/2002 | Hubacek et al. |
| 2003/0080333 A1 | 5/2003 | Yamaguchi et al. |
| 2003/0150476 A1 | 8/2003 | Suzuki |
| 2003/0221702 A1 | 12/2003 | Peebles |
| 2004/0045574 A1 | 3/2004 | Tan |
| 2004/0069320 A1 | 4/2004 | Bergman |
| 2004/0099285 A1 | 5/2004 | Wang et al. |
| 2004/0149699 A1 | 8/2004 | Hofman et al. |
| 2005/0274396 A1 | 12/2005 | Shih et al. |
| 2006/0138081 A1 | 6/2006 | Huang et al. |
| 2006/0141787 A1 | 6/2006 | Ren et al. |
| 2006/0141802 A1 | 6/2006 | Shih et al. |
| 2006/0157448 A1 | 7/2006 | Magni et al. |
| 2008/0092920 A1* | 4/2008 | Shih et al. ............ 134/1 |

FOREIGN PATENT DOCUMENTS

| | | |
|---|---|---|
| JP | 03162593 A | 7/1991 |
| JP | 2002231699 A | 8/2002 |

OTHER PUBLICATIONS

International Search Report and Written Opinion dated Aug. 25, 2008 for PCT/US2008/003969.

* cited by examiner

METHODOLOGY FOR CLEANING OF SURFACE METAL CONTAMINATION FROM ELECTRODE ASSEMBLIES

BACKGROUND

In capacitively coupled plasma (CCP) reactors or chambers, integrated circuits are formed from a wafer or substrate over which are formed patterned microelectronics layers. In the processing of the substrate, plasma is generated between upper and lower electrodes and often employed to deposit films on the substrate or to etch intended portions of the films. The reactors exhibit etch rate drop and etch uniformity drift after a large number of radio frequency (RF) hours are run using the electrodes. The decline of etch performance results from changes in the morphology of the silicon surface of the electrodes as well as contamination of the silicon surface of the electrodes. Thus, there is a need for a systematic and effective methodology to clean the electrodes and reduce surface roughness so that the electrodes meet surface contamination specifications and manufacturing yields are enhanced.

SUMMARY

In one embodiment, provided is method for cleaning an electrode assembly for generating plasma in a plasma chamber comprising a plasma-exposed silicon surface, the electrode assembly comprising a showerhead electrode having a plurality of gas outlets, the method comprising pre-cleaning with nitric acid solution an inner liner of a bath and a component used to suspend the electrode assembly in the bath, wherein the nitric acid solution comprises less than 10% nitric acid; suspending the electrode assembly within the pre-cleaned inner liner of the bath using the pre-cleaned component; soaking the electrode assembly in or cleaning the electrode assembly with ultra-pure water contained within the pre-cleaned inner liner of the bath; removing the electrode assembly from the pre-cleaned inner liner of the bath; and removing contaminants from the silicon surface by contacting the silicon surface with acidic solution comprising hydrofluoric acid, nitric acid, acetic acid, and water. The electrode assembly comprises a showerhead electrode having a plurality of gas outlets.

In another embodiment, provided is a method for cleaning an electrode assembly for generating plasma in a plasma chamber comprising a plasma-exposed silicon surface, the method comprising pre-cleaning with nitric acid solution a fixture used to position the electrode assembly such that the silicon surface faces downward, wherein the nitric acid solution comprises less than 10% nitric acid; placing the electrode assembly on the fixture such that the silicon surface faces downward; and removing contaminants from the downward facing silicon surface by contacting the silicon surface with acidic solution comprising hydrofluoric acid, nitric acid, acetic acid, and water.

DETAILED DESCRIPTION

An exemplary CCP chamber suitable for performing embodiments of the cleaning methods described herein may include: a chamber wall; an upper electrode assembly having a lower surface; a substrate support; an electrostatic chuck supported by the support and operative to hold a substrate or wafer during processing the substrate. The wall preferably includes a wafer transfer slot or gate for transferring the substrate into and out of the chamber. The wall may optionally be coated with a suitable wear-resistant material. To provide an electrical path to ground, the wall may be made of metal, such as aluminum, and electrically grounded. The electrostatic chuck preferably acts as a lower electrode and is coupled to a RF power supply (typically via a matching network). The upper electrode assembly may be coupled to an RF power source (typically via a matching network) and one or more gas lines for process gas. Other types of circuit configuration may be used to power the upper electrode assembly and chuck. For instance, the upper electrode assembly may be grounded to provide a return path for power supplied to the chuck. Alternatively, the chuck may be coupled to two or more RF power supplies having difference frequencies. The upper electrode assembly is spaced apart from the chuck, forming a space for generating plasma therebetween. During operation, the upper electrode assembly and/or chuck electronically excites the process gas into plasma.

The upper electrode assembly may be a single-piece electrode or a multi-piece electrode. For example, the upper electrode assembly may include a singe-piece construction including a showerhead electrode, or it may include a showerhead electrode and one or more outer electrode rings. In such later embodiment, both the showerhead electrode and the outer edge ring may be optionally backed by an aluminum backing plate bonded thereto by a bonding material, such as an elastomer bonding material.

The upper electrode assembly preferably includes an electrode and a backing member, for example, an aluminum backing plate, bonded to the electrode by an elastomeric joint. The elastomeric joint allows movement between the electrode and backing member to compensate for thermal expansion as a result of temperature cycling of the upper electrode assembly. The elastomeric joint may include an electrically and/or thermally conductive filler and the can be a catalyst-cured polymer that is stable at high temperatures. For example, the elastomeric joint may be formed of silicon polymer and the filler may be formed of aluminum alloy or silicon powder. The electrode is preferably formed of single crystalline silicon in order to minimize electrode contamination. The backing member, elastomeric joint, and electrode may include a plurality of holes or gas outlets that allow passage of a process gas through the electrode assembly. Preferably, the diameters of the holes are 1000 µm and 600 µm, respectively.

The performance of the upper electrode assembly deteriorates after a large number of RF hours are run in the chamber, in part due to the formation of black silicon and metal contamination. "Black silicon" can form on the lower surface of the upper electrode assembly, i.e., on the electrode facing the plasma, as a result of the surface being micro-masked by contaminants deposited on the surface during plasma processing operations. Specific plasma processing conditions affected by the formation of black silicon include high nitrogen and low oxygen and $C_xF_y$ concentration at moderate RF power, as used during etching of low-K vias. The micro-masked surface regions can be on the scale of from about 10 nm to about 10 µm. While not wishing to be bound to any particular theory, black silicon formation on the silicon, plasma-exposed surface is believed to occur as a result of non-contiguous polymer deposition during plasma processing operations.

A non-contiguous polymer deposit can form on the plasma-exposed surface during a main etching step for etching a dielectric material on a semiconductor substrate, such as silicon oxide or a low-k dielectric material layer. The polymer deposits are typically three-dimensional, island-like formations that selectively protect the underlying surface from etching. Once needle-like formations are formed, polymer deposits then form preferentially on the needle tips, thereby accelerating the micro-masking mechanism and black silicon propagation during the main etching step for successive substrates. The non-uniform, anisotropic etching of the micro-masked surface region(s) results in the formation of closely-spaced, needle-like or rod-like features on the surface. These features can prevent light from reflecting from the modified regions of the silicon surface, which causes those regions to have a black appearance. The needle-like features typically have a length of from about 10 nm to about 50,000 nm, or even greater in some cases, and a width of from about 10 nm to about 50,000 nm.

It is undesirable for black silicon to form on the plasma-exposed surface because black silicon increases the plasma-exposed surface area of the modified surface. When the extent of the black silicon becomes excessive (i.e., the area(s) of the modified surface region(s) and/or dimensions of the features reach an undesirable level), the black silicon can cause a variation of the etching plasma properties, resulting in a process shift. Consequently, the plasma etching rate can shift from wafer-to-wafer and/or across a wafer surface during single wafer processing of a batch of wafers in the processing chamber. For example, it has been found that the etch rate of a semiconductor substrate can be significantly lower at the surface regions of the semiconductor substrate that are closer to the regions of the electrode at which black silicon is located with localized etching significantly degraded by the excessive formation of black silicon.

In addition to black silicon, the plasma-exposed surface is morphologically modified by the flux of energetic ions, photons, and various neutral atoms and molecules that are generated by the plasma discharge, and by various reactions that occur in the processing of semiconductor substrates. A "morphological change" of the plasma-exposed surface is characterized by a change in surface topography, which is caused by non-uniform removal of material across the width of the surface. For instance, the plasma-exposed surface may have pits, which have a depth of 60-100 µ-inches. Also, the average surface roughness is typically 16 µ-inches. The morphologically modified surface results in a process shift as in the case of black silicon.

During plasma processing, the upper electrode assembly is contaminated by metallic components. The most common metal ions that often fail to conform to contamination specifications include Al, Ca, Mg, Na, and K. Also, there are other metallic elements, such as Ni, Fe, Zn, and Ti, which are found as common contaminants in electrodes. The metallic components are deposited in the pits and on the morphologically modified surface. Also, the metallic components are diffused into and thereby deposited in the electrode. The metallic components can flake-off onto the substrate during substrate transport or plasma processing thereby to contaminate the substrate.

Figure 1:
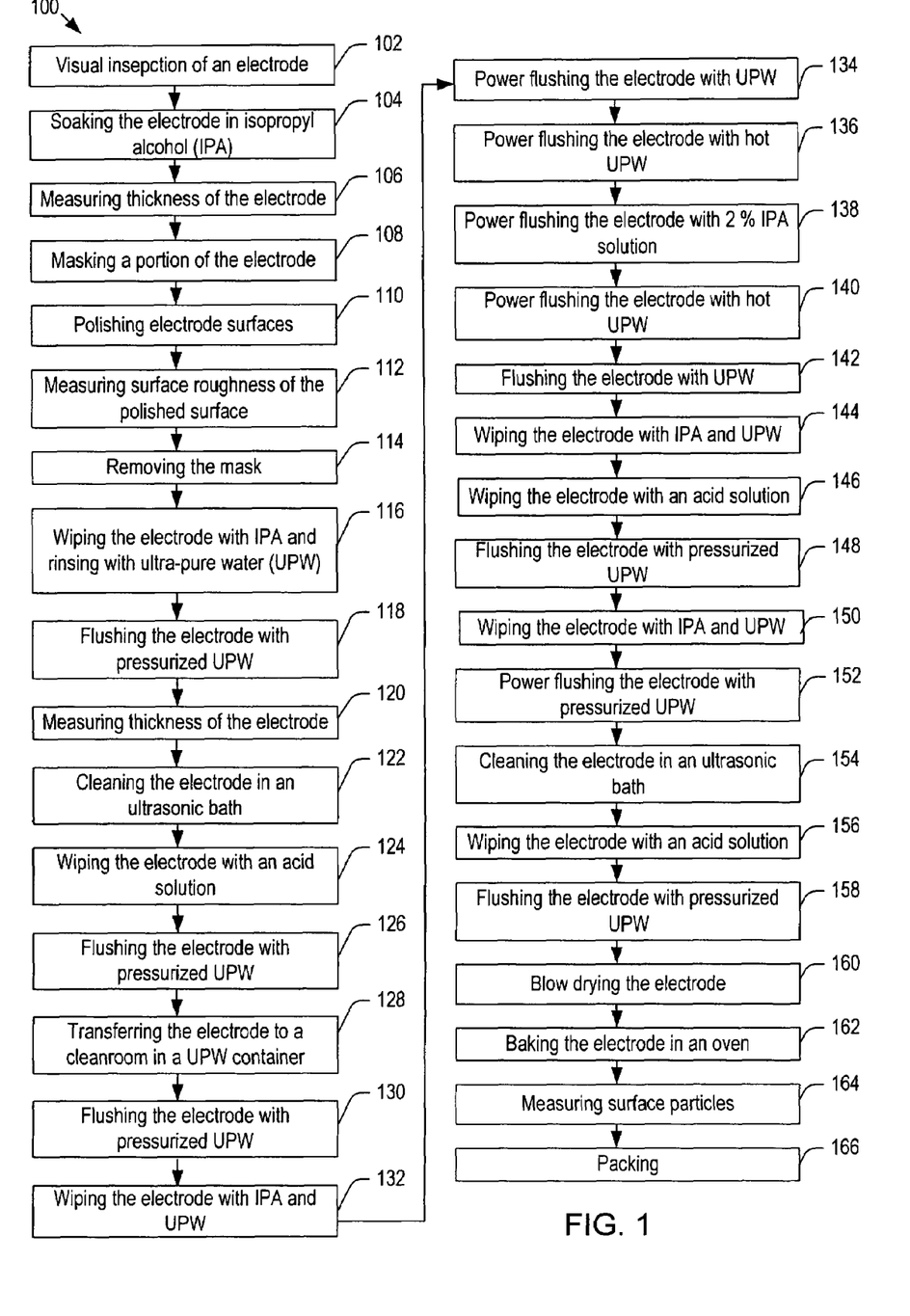
FIG. 1 shows a flow chart illustrating exemplary steps to clean an electrode in accordance with one embodiment.

To remove the black silicon, pits, surface roughness, and metallic contamination, the electrode assembly is taken out of the chamber and cleaned. Alternatively, the cleaning described herein may be applied as a final stage during manufacture of a new electrode assembly. FIG. 1 shows a flow chart 100 illustrating exemplary steps to clean an electrode assembly in accordance with one embodiment. In a step 102, a visual inspection of the electrode assembly is performed to check for damage, such as chipping, cracking, or the like. In step 104, the electrode assembly is soaked in 100% isopropyl alcohol contained in a tank so that organic material is removed from the electrode assembly.

As an optional step to remove foreign materials, the upper electrode assembly may be pre-cleaned prior to step 104 (not shown in FIG. 1). Such pre-cleaning may include $CO_2$ snow blasting, which involves directing a stream of small flakes of dry ice at the surface being treated, so that the flakes hit small particulate contaminants less than 1 µm in size on the electrode surfaces, then vaporize via sublimation, lifting the contaminants from the electrode surfaces. The contaminants and the $CO_2$ gas then typically are passed through a filter, such as high efficiency particulate air (HEPA) filter, where the contaminants are collected and the gas is released. An example of a suitable snow-generating apparatus is Snow Gun-II™, commercially available from Vatran System, Inc. (Chula Vista, Calif.).

In step 106, the thicknesses of the electrode, backing member, and elastomeric joint are measured. Next, in step 108, the backing member and the elastomeric joint are masked to obviate damage to the backing member and the possibility of particles becoming trapped in the elastomeric joint during polishing in step 110.

Step 110 polishing preferably comprises grinding a surface of the upper electrode assembly on a lathe using a grinding wheel with an appropriate roughness grade number and polishing the electrode surface to a desired finish (e.g., 8 µ-inches) using another wheel. Preferably, the silicon surface is polished under constant running water to remove grit and keep the electrode wet. When water is added, a slurry may be generated during the polishing, which is to be cleaned from the electrode surface. The electrode may be polished first using an ErgoScrub™ and ScrubDISK. The polishing procedure (i.e., the selection and sequence of the polishing paper used), depends on the degree of damage of the electrode surfaces to be cleaned.

If severe pitting or damage is observed on the electrode surfaces, polishing can begin with, for example, a 140 or 160 grit diamond polishing disk until a uniform flat surface is achieved. Subsequent polishing may be performed with, for example, 220, 280, 360, 800, and/or 1350 grit diamond polishing disks. If minor pitting or damage is observed on the electrode surfaces, polishing can begin with a 280 grit diamond polishing disk. Subsequently, 360, 800, and/or 1350 grit diamond polishing disks may be used to complete the polishing.

During polishing, the upper electrode assembly is attached to a turntable, with a suitable rotation speed. A uniform, but not excessively strong, force is preferably applied during polishing, as a strong force may cause damage to the plasma-exposed surface or elastomeric joint. The polishing process may take about 75 minutes or more, depending on the degree of pitting or damage on the electrode surfaces. After polishing, the surface roughness of the polished surface is measured using, for example, Surfscan™ measuring system, in step 112. The allowable surface roughness is preferably approximately 8 μ-inches or less. Then, the mask is removed from the electrode in step 114, and the process proceeds to step 116.

In carrying out the steps of cleaning the electrode assembly, metal contamination of the electrode assembly may originate from several different sources. To analyze the contribution of suspicious contamination sources, extensive particle analysis is preferably performed. The analysis may include monitoring airborne particles in cleanrooms (e.g., class-10, -100, and -1000 cleanrooms) and non-cleanrooms used in the cleaning process, as well as the vacuum oven used in step 162, described further below. To monitor the number and composition of the airborne particles in a cleanroom, a surface of a fresh silicon wafer is exposed to the atmosphere of the cleanroom for a preset time interval, allowing the airborne particles to settle on the surface of the wafer. Then, the silicon wafer is packed in a cleanroom bag and sent to a laboratory for quantitative analysis, such as surface particle count, of the collected airborne particles. Based on past analyses, it is believed that cleanrooms and the vacuum oven probably do not contribute significantly contamination of metallic components. However, silicon wafers that are wiped with acidic solution in a non-cleanroom may show significant metallic contamination compared to those wiped in a cleanroom (e.g., the amount of chromium and zinc may show an order of magnitude difference). As such, in a preferred embodiment, steps 112-132 are performed in a cleanroom, preferably a class-100 or higher cleanroom.

The particle analysis preferably also includes contamination measurements of the gas, such as $N_2$ or clean-dry-air, used in the blow-drying process in step 160, described further below. A fresh wafer is blow-dried for a preset time interval, preferably 15 minutes, and the surface particle count is performed to measure the metallic contamination in the gas. Similar analysis is performed with a gas filter for filtering the gas. Based on past analyses, in a preferred embodiment, a 0.01 μm gas filter is used.

The particle analysis preferably further includes measuring contamination levels of the various tools/solutions used in the wet cleaning processes in order to help identify sources of contamination. The tools/solutions to be monitored may include, for example, the inner liner of the ultrasonic bath; the wiping tool 200 of FIG. 2, described below; the fixture 208 of FIG. 3A, described below; and samples of isopropyl alcohol, acidic solution, and ultra-pure water used in various steps in FIG. 1. To measure the contribution of the inner liner of the ultrasonic bath, a fresh wafer is immersed in ultra-pure water in the liner, dried, and analyzed by counting the surface particles. Past analyses show that the inner liner may significantly contaminate the wafer if the inner liner is used without pre-cleaning. For instance, particle counts of aluminum and magnesium particles on the surface of a wafer may be 2-3 orders of magnitude higher than those on the surface of fresh wafer. Accordingly, in a preferred embodiment, the inner liner of the ultrasonic bath is pre-cleaned by performing the steps of: wiping with nitric acid solution, for example, solution that comprises less than 10% nitric acid, more preferably about 2% nitric acid; rinsing with ultra-pure water; wiping with isopropyl alcohol; and rinsing with ultra-pure water. Similar tests are preferably performed to determine the contribution of the transfer tank used in step 128 (i.e., fresh wafer is immersed in ultra-pure water contained in the transfer tank, dried, and analyzed by counting the surface particles). Past test results indicate that the transfer tank may increase the particle count of aluminum and magnesium on a wafer surface by a factor of 1000-2200. As such, the transfer tank is preferably pre-cleaned prior to step 128, described further below. Likewise, the particle count on the surfaces of the wiping tool 200 and the fixture 208 may be measured to conclude that similar pre-cleaning of the wiping tool 200 and fixture 208 is required to reduce the metallic contamination of the electrode assembly.

Figure 2:
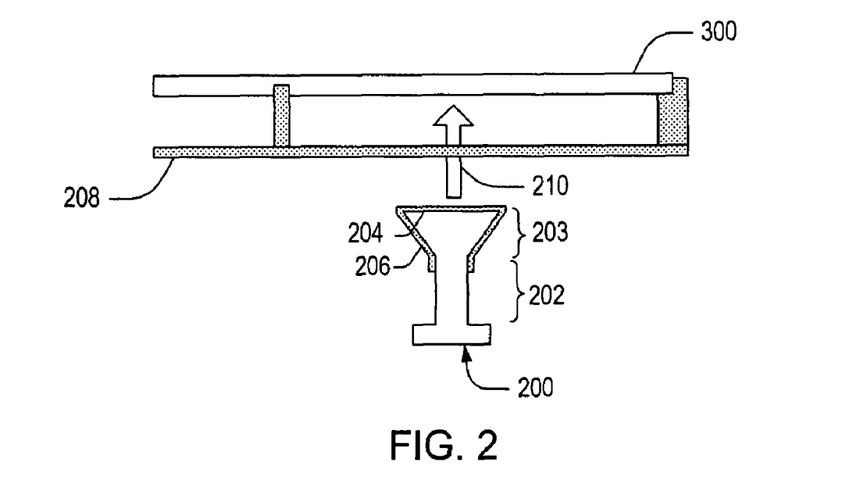
FIG. 2 shows a schematic cross sectional view of a fixture for wiping an electrode assembly in accordance with another embodiment.
Figure 3A:
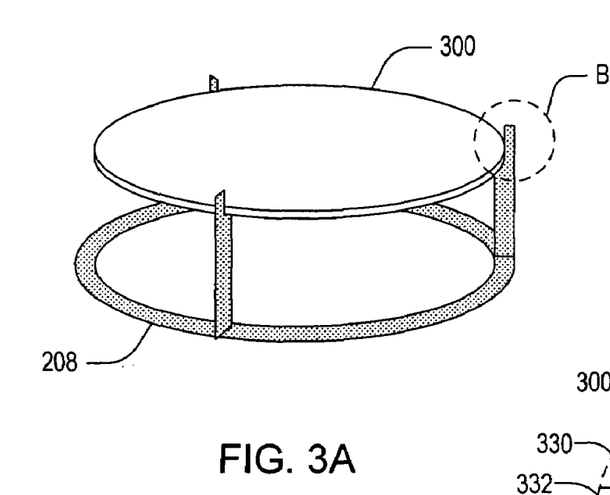
FIG. 3A shows a perspective view of the fixture in FIG. 2.
Figure 3B:
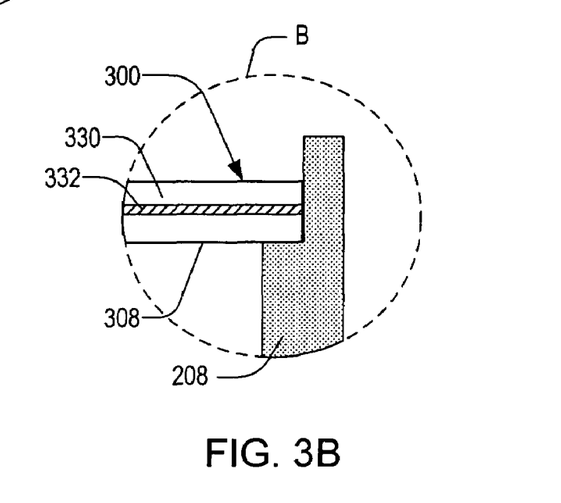
FIG. 3B shows an enlarged cross sectional view of region B in FIG. 3A.

In step 116, the electrode assembly is wiped with isopropyl alcohol and rinsed with ultra-pure water. FIG. 2 shows a schematic cross sectional view of a fixture for wiping of an electrode assembly 300, wherein the electrode assembly 300 is mounted on the fixture 208. FIG. 3A shows a perspective view of the fixture 208 supporting the electrode assembly 300 and FIG. 3B shows an enlarged schematic cross section view of the region B in FIG. 3A. A custom wiping tool 200 in FIG. 2 is preferably formed of Teflon® (polytetrafluoroethylene) and includes a handle portion 202 and a frusto-conical section 203. The frusto-conical section 203 has a flat surface 204 to be covered with a wiper 206, which, during wiping, is wetted with cleaning solution, in this case isopropyl alcohol. The operator of the wiper tool 200 preferably holds the handle portion 202 and applies an upward force 210 to contact the upward facing flat surface 204 of the wiping tool 200 with the downward facing silicon surface of the electrode assembly 300. Further, the fixture 208 may be rotated during the cleaning.

As shown in FIGS. 2, 3A, and 3B, the fixture 208, sized to the electrode assembly 300 to be cleaned, has a sturdy base and three or more supporting members that support the electrode assembly 300 above a working bench surface, allowing the downward facing silicon surface of the electrode assembly 300 to be cleaned. The top of each supporting member preferably has a step on which the electrode assembly 300 rests and which prevents the electrode assembly from slipping off the supporting members. The supporting members and base are preferably coated with and/or made from a chemically resistant material, such as Teflon®, which is chemically resistant to acids.

The electrode assembly 300 (i.e., both the backing member and the silicon surface) are wiped with isopropyl alcohol. After wiping, the wiper 206 is visually inspected to check particle removal quality, i.e., if there is any visible residue on the wiper 206. The operator may repeat wiping the electrode assembly with fresh wipers soaked with isopropyl alcohol until there is no visible residue on the wipe. The repeated wiping not only reduces the surface roughness, but also reduces surface contamination to a certain degree. Next, the process may proceed to step 118.

In step 118, to remove particles that may be trapped in the holes or gas outlets and pits, the electrode assembly is sprayed with ultra-pure water using a magnum water gun, such that the ultra-pure water passess through the holes or gas outlets and clears the holes or gas outlets from any particles that may be trapped therein. The water pressure in the flushing process is preferable 40-50 psi and the flushing process takes about 15 minutes. During the process of flushing the electrode assembly in step 118, the ultra-pure water may be recycled, provided the flushing system has a metal/particle filter. In such cases, the resistivity of the ultra-pure water is measured during flushing so that the contamination level in the recycled ultra-pure water is monitored. In a preferred embodiment, the allowable limit of the ultra-pure water resistivity is about 180 M Ω-cm. Following the step of flushing the electrode assembly, the electrode assembly may be blow-dried with $N_2$ or clean-dry-air and the thicknesses of the components of the electrode assembly (i.e., the backing member, the electrode, etc.) are measured to determine whether the components of the electrode assembly conform to product specifications in step 120. Then, the process proceeds to step 122.

In step 122, the electrode assembly is soaked in ultra-pure water contained in an inner liner of an ultrasonic bath to loosen the particles trapped in the gas outlets and stuck to the electrode surfaces. Typically, an ultrasonic bath is formed of metal, such as stainless steel, which introduces metallic contaminants into the ultra-pure water contained therein during ultrasonic cleaning. To avoid direct contact of ultra-pure water with the metal bath and thereby to obviate the introduction of metallic contaminants, the ultra-pure water is contained in an inner liner of the ultrasonic bath, wherein the inner liner may be formed of material, such as polyethylene or high-density-polyethylene, which is resistant to acid and deposition of contaminant thereon. The electrode assembly is ultrasonically cleaned while immersed in ultra-pure water. The electrode assembly may be moved up and down within the ultrasonic bath during the ultrasonic cleaning in order to help remove trapped particles. If Teflon® bars or Teflon® coated electrode holder is used to suspend the electrode assembly in the liner during the ultrasonic cleaning, the bars or holder is pre-cleaned prior to the ultrasonic cleaning. The pre-cleaning steps includes: wiping with nitric acid solution, for example, solution that comprises less than 10% nitric acid, more preferably about 2% nitric acid; rinsing with ultra-pure water; wiping with isopropyl alcohol; and rinsing with ultra-pure water. The resistivity of the ultra-pure water in the liner may be measured so that the contamination level of the ultra-pure water is monitored. In a preferred embodiment, the allowable limit of the ultra-pure water resistivity is about 180 M Ω-cm. Then, the process proceeds to step 124.

In step 124, the silicon surface is wiped with acidic solution comprising hydrofluoric acid, nitric acid, acetic acid and balance water, preferably ultra-pure water, as disclosed in commonly owned U.S. Patent Application Publication No. 2006/0141802 A1, the content of which is hereby incorporated by reference in its entirety. The cleaning with acidic solution comprising hydrofluoric acid, nitric acid, acetic acid and water preferably does not cause silicon surface morphological damage, such as pitting or surface roughness, or silicon surface color change, which reflects surface non-cleanliness as well as oxidation state changes.

With regard to the hydrofluoric acid and nitric acid components of the acidic solution, the chemical reaction of a solution of hydrofluoric acid and nitric acid with the silicon surface is:

$$3Si+12HF+4HNO_3 \rightarrow 3SiF_4+4NO+8H_2O.$$

The dissolution rate of hydrofluoric acid is low, due to the low reaction constant of hydrofluoric acid. After treatment with a solution containing hydrofluoric acid, infrared spectroscopy analysis may reveal that the silicon surface is covered by $SiH$, $SiH_2$, and $SiH_3$.

While not wishing to be bound by theory, it is believed that in the etching of silicon by acidic solution of hydrofluoric acid and nitric acid, an electrochemical reaction takes place in which silicon is oxidized by nitric acid, followed by dissolution of the oxidized silicon by hydrofluoric acid. In an acidic solution with a low concentration of hydrofluoric acid, the activation energy of the etching process is 4 kcal/mol, at temperatures of 0 to 50° C. This single, low value is characteristic of a diffusion-controlled process, illustrated by the fact that the etch rates of different silicon materials are essentially the same at low concentrations. In contrast, in an acidic solution with a high concentration of hydrofluoric acid, two different activation energies are observed. At high temperatures the activation energy is 10-14 kcal/mol and at low temperatures the activation energy is approximately 20 kcal/mol. These values are characteristic of a surface-controlled process, in which dopant concentration of the silicon, crystal orientation of the silicon, and defects of the silicon play a role in the etching process.

Accordingly, acidic solution used in step 124 preferably contains a low concentration of hydrofluoric acid, in order to avoid etch rate dependency on dopant concentration, crystal orientation, during the cleaning of the silicon surface. The acidic solution preferably etches silicon isotropically (non-directionally, i.e., the etch rate being relatively constant in all directions), as opposed to etching silicon anisotropically (unidirectionallly). While hydrofluoric acid can remove some metal impurities by forming complex ions with the metal impurities, hydrofluoric acid is not effective to remove, for example, Cu. However, nitric acid, a strong oxidizer, can react with impurities such as, for example, Al, Ca, Cr, Cu, Fe, K, Li, Mg, Mo, Na, Ni, Ti, Zn, and combinations thereof, to form ions, which can readily be removed. Nitric acid is preferably present in an amount that does not cause color change of the cleaned silicon surface.

Accordingly, acidic solution of hydrofluoric acid and nitric acid can achieve high decontamination efficiency of electrode silicon surfaces to meet dielectric etching process requirements for small etch feature sizes of 0.1 μm and less. However, as nitric acid is a strong oxidizer, when a contaminated silicon surface is exposed to a solution of hydrofluoric acid and nitric acid, nitric acid both oxidizes metal contaminants and reacts with the silicon, thereby causing silicon surface color change, including green, blue, brown, and purple. Experiments indicated that even for polished silicon electrode assemblies rinsed with water, wiping the silicon surface with a solution of hydrofluoric acid and nitric acid caused the silicon surface color to change from a bright, uniform color to greenish, bluish, brownish, or purplish, depending on the metal contaminants present on the silicon surface.

In order to control the oxidation rate and provide a buffer solution to maintain a constant pH value, acetic acid is added to avoid silicon surface color change while maintaining high decontamination efficiency and surface cleanliness. However, as a high concentration of acetic acid may slow the silicon surface reaction and reduce cleaning efficiency, the silicon surface may exhibit color change. Further, the acetic acid may form complex ions with contaminants, e.g., metal ions. Accordingly, the acidic solution may comprise 0.25 to 1% by volume hydrofluoric acid, 10 to 40% by volume nitric acid, 10 to 20% by volume acetic acid, and balance water.

To reduce the risk that the elastomeric joint of the upper electrode assembly is chemically attacked by acidic solution, metal contaminants are removed by contacting the silicon surface with acidic solution by wiping, as opposed to soaking the entire electrode assembly in acidic solution. Accidental contact of acidic solution with the backing member or elastomeric joint is thus avoided by contacting only the silicon surface with acidic solution and by means of the fixture 208 that allows the silicon surface to be supported facing downward, as shown in FIG. 3B, while the silicon surface is cleaned. With the silicon surface 308 supported facing downward, excess acidic solution applied to the silicon surface 308 can be collected after dripping off of the silicon surface 308, as opposed to flowing to the backing member 330 or elastomeric joint 332. The backing member 330 and elastomeric joint 332 are preferably immediately cleaned with ultra-pure water if contacted with acidic solution. Additionally, exposed elastomeric joint 332 is preferably protected by covering with masking material and/or chemical resistant tape prior to cleaning with acidic solution. Additional measures to avoid accidental contact of acidic solution with the backing member 330 or elastomeric joint 332 include drying the electrode assembly 300 after wiping using compressed nitrogen gas or clean-dry-air, blown from the backing member 330 down to the silicon surface 308, and blowing any residual solution from the silicon surface 308.

In step 124, the silicon surface is wiped preferably three times for three minutes each. The number of repetitions and duration of each wiping process are preferably adjusted such that a desired depth, e.g., 1.5-2.0 µm, of the silicon layer is removed. Then, in step 126, the electrode assembly is flushed with ultra-pure water as in step 118.

After completion of step 126, the silicon surface may have an allowable roughness. Also, black silicon and organic material deposited on the surfaces of the electrode assembly may be removed to produce a desired finish on the surface. However, steps 104-126 may not be sufficient to reduce metallic contamination down to a desired level, wherein typical metallic contaminants include Al, Ca, Mg, Na, K, Ni, Fe, Zn, and Ti. To further remove the metallic contaminants, the following steps are performed.

In step 128, the electrode assembly is immersed in ultra-pure water in a container, preferably formed of polyethylene, so that acidic solution is removed from the electrode assembly. Also, the electrode assembly may be transferred to a cleanroom, preferably class-100 or higher cleanroom, in the ultra-pure water container so that the following steps are performed in the cleanroom, i.e., the ultra-pure water container is used as a transfer tank. As steps 102-126 can be performed outside a cleanroom, these steps may collectively be referred to as pre-decontamination steps. Then, the process proceeds to step 130.

In step 130, the electrode assembly is flushed with pressurized ultra-pure water as in step 104. Potential damage of the elastomeric joint or backing member by residual acidic solution may be further reduced by rinsing the backing member with ultra-pure water prior to step 130. With the electrode assembly supported in the fixture 208 with the silicon surface facing downward, the electrode assembly is preferably be rinsed from the backing member down to the silicon surface with ultra-pure water passing through gas holes.

As noted above, the fixture 208 may be pre-cleaned to reduce contamination of the electrode assembly. The steps for pre-cleaning the fixture 208 includes: wiping with nitric acid solution, for example, solution that comprises less than 10% nitric acid, more preferably about 2% nitric acid; rinsing with ultra-pure water; wiping with isopropyl alcohol; and rinsing with ultra-pure water. Likewise, the wiping tool 200, the inner liner of the ultrasonic bath, the container for transferring the electrode assembly in step 128, and any other tools that may contact with the electrode either directly or indirectly, may be pre-cleaned.

In step 132, the electrode assembly is wiped with isopropyl alcohol and ultra-pure water as in step 116. Subsequently, in steps 134-140, the electrode assembly is power-flushed using four different solutions: 1) ultra-pure water, preferably at the pressure of 40-50 psi and flow rate of 6.0-8.0 gallons per minute (GPM) for 5 minutes; 2) hot ultra-pure water, preferably at the pressure of 40-50 psi and temperature of 120° F. for 15 minutes; 3) 2% isopropyl alcohol, preferably at the pressure of 40-50 psi and flow rate of 3.5-4.5 GPM for 30 minutes; and 4) hot ultra-pure water, preferably at the pressure of 40-50 psi and temperature of 120° F. and flow rate of 3.5-4.5 GPM for 15 minutes.

Figure 4:
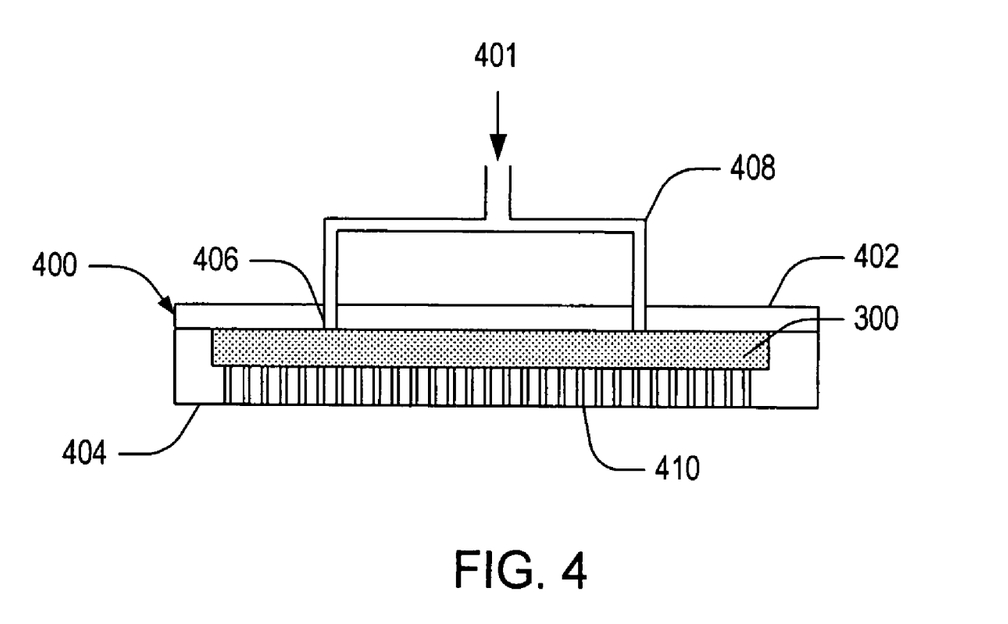
FIG. 4 shows a schematic cross sectional diagram of an appliance for power flushing an electrode assembly in accordance with another embodiment.

FIG. 4 shows a schematic cross sectional diagram of an appliance 400 using in the power flushing of steps 132, 134, 136, 138, and 140. As depicted, the appliance 400 includes an upper cover 402 that is a generally circular plate with several holes 406 connected to flow pipes 408, wherein cleaning fluid 401, preferably pressurized cleaning fluid 401, such as ultra-pure water or 2% isopropyl alcohol solution, are fed through the pipes 408. The appliance 400 also includes a lower container 404 in which the electrode assembly is placed. The cleaning fluid 401 fed through the holes 406 passes through the holes of the electrode assembly 300, thereby cleaning the holes and surfaces of the electrode assembly 300. The lower container 404 includes a plurality of drain holes 410 through which the contaminated fluid exits. The contaminated fluid may be collected and filtered by a recycling system. The appliance 400 may be pre-cleaned before power flushing to reduce the potential contamination of the electrode assembly 300 by the appliance 400. After power flushing, the process proceeds to step 142.

In steps 142-158, some of the previous steps are repeated to clean the electrode. In step 142, the electrode assembly is flushed with ultra-pure water as in step 118. In step 144, the electrode assembly is wiped with isopropyl alcohol and ultra-pure water as in step 132. In step 146, the silicon surface is wiped with acidic solution as in step 124. In step 148, the electrode assembly is flushed as in step 118. In step 150, the electrode assembly is wiped with isopropyl alcohol and ultra-pure water as in step 132. In step 152, the electrode assembly is power flushed as in step 134. In step 154, the electrode assembly is cleaned in an ultrasonic bath as in step 122. In step 156, the silicon surface is wiped with acidic solution as in step 124 so that the remaining metallic contaminants can be removed from the electrode. In step 158, the electrode assembly is flushed with ultra-pure water as in step 118. Then, the process proceeds to step 160.

In step 160, the electrode assembly is blow-dried with $N_2$ gas or clean-dry-air passed through 0.01 µm gas filter. Extra care is taken not to touch the blow-dried silicon surface in the following steps, thereby obviating contamination introduced by handling. In step 162, to further remove water from the electrode assembly, the electrode assembly is baked in a vacuum oven at 120° C., preferably about 3 hours. During baking, separation tools (i.e., a component used to support the electrode assembly in the vacuum oven), such as Teflon® bars or plates, are positioned between the electrode assembly and the oven inner wall such that direct contact between the electrode assembly and oven inner wall is prevented and thereby contamination of the electrode assembly due to the oven inner wall is prevented.

Subsequent to step 162, the electrode assembly is preferably inspected to ensure that the electrode assembly conforms to contamination specification. In step 164, inspection may include measuring, for example, surface particle count as measured by, for example, a QIII®+Surace Particle Detector (Pentagon Technologies, Livermore, Calif.). Also, if necessary, other measurements of various dimensions, such as surface roughness, surface cleanness of the wipers using Inductively Coupled Plasma Mass Spectrometry Analysis, surface morphology using scanning electron microscope, and black silicon pits and etch depth, may be measured. If the electrode assembly conforms to contamination specification, the electrode assembly is double packed in class-100 cleanroom bags in step 166.

The operator preferably wears gloves during performance of the steps of FIG. 1 (especially steps 116, 124, 132, 144, 146, 150, and 156 for wiping the electrode/electrode assembly) and handling the electrode assembly between the steps so that the contamination from the hands of the operator is prevented. Also, whenever necessary, the operator may put on new gloves to prevent contaminants or particles generated in one step from being transferred to subsequent steps. Various types of glove materials were tested to determine the optimum glove material. Table 1 provides results from an Inductively Coupled Plasma Mass Spectrometry (ICP-MS) analysis on two exemplary gloves—class-M1.5 polyvinyl chloride (PVC) gloves (manufactured by Oak Technical, Talbott, Tenn.) and class-100 nitrile gloves. In the analysis, each glove was contacted with acidic solution and the resulting amounts of metallic elements on the gloves were measured. The results are presented in Table 1, below, which indicates that with the exception of sodium and nickel, the class-M1.5 PVC gloves generated less metallic elements than the class-100 nitrile gloves. While not included, similar tests were performed to determine the effects of ultra-pure water and isopropyl alcohol on the formation of metallic elements. Based on the results, in a preferred embodiment, an operator wears inner and outer gloves, wherein the inner gloves are class-100 nitrile gloves and the outer gloves are PVC gloves, for example, class-M1.5 PVC gloves. As depicted in FIG. 2, a cleanroom wiper 206 enwraps an upper portion of the wiping tool 200. To avoid direct contact of the gloves with acidic solution during wiping, preferably only the portion of the wiper 206 covering the top surface 204 of the wiping tool 200 is wetted with acidic solution.

TABLE 1

| Element | PVC glove (ng) | Nitrile glove (ng) | Class-100 wiper (ng) | non-cleanroom wiper (ng) |
|---|---|---|---|---|
| Aluminum (Al) | 730 | 45,000 | 80 | 20 |
| Calcium (Ca) | 52,000 | 1,500,000 | <100 | 24,000 |
| Chromium (Cr) | <50 | <50 | <10 | <10 |
| Cobalt (Co) | <50 | <50 | * | * |
| Copper (Cu) | <50 | <50 | <10 | 60 |
| Iron (Fe) | 1000 | 6200 | * | * |
| Lithium (Li) | <50 | <50 | <5 | 77 |
| Magnesium (Mg) | 800 | 20000 | <10 | 3,600 |
| Molybdenum (Mo) | <50 | <50 | * | * |
| Nickel (Ni) | 1200 | 150 | <10 | 10 |
| Potassium (K) | 600 | 1200 | 200 | 8,000 |
| Sodium (Na) | 26,000 | 4,700 | 180 | 160,000 |
| Titanium (Ti) | <50 | 2,900 | <100 | <100 |
| Zinc (Zn) | 13,000 | 83,000 | <100 | 100 |

Likewise, various types of cleanroom wipers were tested to determine the optimum wiper, in terms of material and fabric structure. In the test, each wiper was wetted with isopropyl alcohol, ultra-pure water, or acidic solution. Then, an ICP-MS analysis was performed on the wetted wiper to measure the amounts of metallic elements on the wetted area. Table 1 contains results for two wipers wetted with acidic solution. The class-100 cleanroom wiper generated less metallic elements, i.e., was more resistant to the acidic solution, than a non-cleanroom wiper. Based on the results, in a preferred embodiment, cleanroom wipers, such as class-100 acid resistance cleanroom wipers manufactured by VWR LabShop (BataVia, Ill.), which are made of knitted polyester with sealed edges and laundered, are used.

While various embodiments have been described, it is to be understood that variations and modifications may be resorted to as will be apparent to those skilled in the art. For example, some steps shown in FIG. 1 may be skipped or repeated. Such variations and modifications are to be considered within the purview and scope of the claims appended hereto.

What is claimed is:

1. A method for cleaning an electrode assembly for generating plasma in a plasma chamber comprising a plasma-exposed silicon surface, the method comprising:
   pre-cleaning with a nitric acid solution an inner liner of a bath and a component used to suspend the electrode assembly in the bath, wherein the nitric acid solution comprises less than 10% nitric acid;
   suspending the electrode assembly within the pre-cleaned inner liner of the bath using the pre-cleaned component;
   soaking the electrode assembly in or cleaning the electrode assembly with ultra-pure water contained within the pre-cleaned inner liner of the bath;
   removing the electrode assembly from the pre-cleaned inner liner of the bath; and
   removing contaminants from the silicon surface of the electrode assembly by contacting the silicon surface with an acidic solution comprising hydrofluoric acid, nitric acid, acetic acid, and water,
   wherein the electrode assembly comprises a showerhead electrode having a plurality of gas outlets.

2. The method of claim 1, wherein the bath comprises an ultrasonic bath, the method comprising ultrasonically cleaning the electrode assembly with ultra-pure water contained within the pre-cleaned inner liner of the ultrasonic bath.

3. The method according to claim 1, wherein the inner liner of the bath comprises polyethylene.

4. The method according to claim 1, wherein the component used to suspend the electrode assembly in the bath comprises polytetrafluoroethylene.

5. The method according to claim 1, wherein the pre-cleaning with the nitric acid solution comprises wiping with the nitric acid solution, rinsing with ultra-pure water, wiping with isopropyl alcohol, and rinsing with ultra-pure water.

6. The method according to claim 1, further comprising contacting the silicon surface of the electrode assembly with a wiper wetted with isopropyl alcohol or soaking the electrode assembly in isopropyl alcohol contained in a tank.

7. The method according to claim 1, wherein contacting the silicon surface with the acidic solution comprises contacting the silicon surface with a wiper wetted with the acidic solution.

8. The method according to claim 1, further comprising flushing the electrode assembly with ultra-pure water.

9. The method according to claim 1, further comprising blow drying the electrode assembly, baking the electrode assembly in a vacuum oven, and pre-cleaning with nitric acid solution a component used to support the electrode assembly in the vacuum oven, wherein the nitric acid solution comprises less than 10% nitric acid.

10. The method according to claim 1, further comprising:
    pre-cleaning with nitric acid solution a tank used to transport the electrode assembly to a cleanroom, wherein the nitric acid solution comprises less than 10% nitric acid; and
    transporting the electrode assembly in the pre-cleaned tank to a cleanroom in which the silicon of the electrode assembly surface is contacted with the acidic solution comprising hydrofluoric acid, nitric acid, acetic acid, and water.

11. The method according to claim 1, further comprising:
    pre-cleaning with nitric acid solution an appliance that contains the electrode assembly during a power flushing step, wherein the nitric acid solution comprises less than 10% nitric acid, and further wherein the appliance comprises:
    an upper cover having one or more inlets connected to at least one supply of pressurized cleaning fluid for the power flushing; and
    a lower portion having drainage and in which the electrode assembly is placed; and
    power flushing the electrode assembly supported in the pre-cleaned appliance with isopropyl alcohol solution or ultra-pure water, wherein the power flushing comprises supplying pressurized cleaning fluid to the appliance through the one or more inlets, and further wherein the power flushing cleans gas holes and surfaces of the electrode assembly.

12. The method according to claim 1, wherein the electrode assembly comprises an aluminum backing member elastomer bonded to a silicon electrode.

13. The method according to claim 1, wherein removed contaminants are selected from the group consisting of Al, Ca, Mg, Na, K, Ni, Fe, Zn, Ti, and combinations thereof.

14. The method according to claim 1, wherein the acidic solution comprises 0.25 to 1% by volume hydrofluoric acid, 10 to 40% by volume nitric acid, and 10 to 20% by volume acetic acid.

15. The method according to claim 1, wherein the nitric acid solution used in the pre-cleaning comprises about 2% nitric acid and balance water.

16. The method according to claim 1, further comprising removing black silicon from the silicon surface of the electrode assembly.

17. The method according to claim 6, further comprising pre-cleaning with nitric acid solution the tank containing the isopropyl alcohol, wherein the nitric acid solution comprises less than 10% nitric acid.

18. The method according to claim 12, wherein the aluminum backing member comprises a plate or ring.

* * * * *